(12) United States Patent
Schmidbauer et al.

(10) Patent No.: US 6,403,473 B1
(45) Date of Patent: Jun. 11, 2002

(54) PROCESS FOR PRODUCING METAL-CONTAINING LAYERS

(75) Inventors: Sven Schmidbauer; Alexander Ruf; Oliver Gehring, all of Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/315,329

(22) Filed: May 20, 1999

(30) Foreign Application Priority Data

May 20, 1998 (DE) ......................... 198 22 749

(51) Int. Cl.⁷ ............................... H01L 21/44
(52) U.S. Cl. ................. 438/656; 438/648; 438/660; 438/683; 438/685
(58) Field of Search ................. 438/648, 649, 438/651, 655, 656, 660, 663, 672, 675, 680, 682, 683, 685, 658

(56) References Cited

U.S. PATENT DOCUMENTS

| | | | | |
|---|---|---|---|---|
| 3,655,544 A | * | 4/1972 | Rairden, III | 204/192 |
| 5,021,353 A | * | 6/1991 | Lowrey et al. | 438/231 |
| 5,213,848 A | * | 5/1993 | Zurecki et al. | 427/449 |
| 5,401,677 A | | 3/1995 | Bailey et al. | 438/651 |
| 5,444,018 A | * | 8/1995 | Yost et al. | 438/649 |
| 5,453,400 A | | 9/1995 | Abernathey et al. | 438/620 |
| 5,610,099 A | * | 3/1997 | Stevens et al. | 438/626 |
| 5,626,920 A | * | 5/1997 | Weir et al. | 427/530 |
| 5,811,182 A | * | 9/1998 | Weir et al. | 428/336 |
| 5,990,005 A | * | 11/1999 | Hirose et al. | 438/660 |

FOREIGN PATENT DOCUMENTS

| | | | | |
|---|---|---|---|---|
| DE | 19822749 | * | 12/1999 | ....... H01L/21/3205 |
| JP | 04042412 | * | 2/1992 | ........... G11B/5/187 |

OTHER PUBLICATIONS

S. Wolf, "Silicon Processing for the VLSI Era", vol. 2, Lattice Press, Sunset beach, CA, USA, 1990.*
"Surface nucleation of Ti silicides at elevated temperatures", R.T. Tung, Appl. Phys. Lett. 68 (14), Apr. 1, 1996, pp. 1933–1935.
"Influence of the sputtering method of TiN/Ti films on the resistance of high aspect ratio contact holes", R. Kanamura et al., VMIC Conference, Jun. 1996, pp. 554–559.
"Tungsten Contacts for a 265M DRAM Process Using a Thermally Formed TiN Diffusion Barrier", J. Gambino et al., VMIC Conference, Jun. 1996, pp. 1801–180k.
"Nitridation of Polycrystalline Titanium as Studied by in situ Angle–resolved X–Ray Photoelectron Spectrscopy", A. Ermolieff et al., Surface and Interface Analysis, vol. 11, 563–563.

* cited by examiner

Primary Examiner—Olik Chaudhuri
Assistant Examiner—Ginette Peralte
(74) Attorney, Agent, or Firm—Herbert L. Lerner; Laurence A. Greenberg; Werner H. Stemer

(57) ABSTRACT

A process for producing metal-containing layers, in particular metal-containing diffusion barriers, contact layers and/or antireflection layers. The process according to the invention has a first step in which a metal layer having a predetermined thickness at an elevated temperature is applied to a semiconductor structure. Next, the metal layer is cooled in a nitrogen-containing atmosphere, resulting in a metal nitride layer being formed.

13 Claims, 4 Drawing Sheets

PROCESS FOR PRODUCING METAL-CONTAINING LAYERS

BACKGROUND OF THE INVENTION

Field of the Invention

The present invention relates to a process for producing metal-containing layers, in particular metal-containing diffusion barriers, contact layers and/or antireflection layers, in particular for use in CMOS circuits or DRAM memory modules and also in so-called "embedded DRAM" modules.

Integrated circuits, in particular CMOS circuits or DRAM memory modules, are fabricated by a multiplicity of process steps. The costs for fabricating these circuits are in this case determined by the process complexity and the physical processing time. Highly complex modules frequently require several hundred individual process steps and multiple days for completing the process cycle of the product.

Some of the process steps have to be used for the contact-making of doped regions in the semiconductor substrate or for the contact-making of two conductive layers. In modern DRAM and logic generations, contacts between silicon and tungsten are frequently used for the contact-making of doped regions in the semiconductor substrate. However, it is possible to use other metals such as, for example, aluminum. In order to avoid undesirable tungsten-silicon reactions ("encroachment", "wormholes") or aluminum-silicon reactions ("spiking"), metal-containing layers, for example Ti/TiN layers, are frequently employed as contact or barrier layers between silicon and tungsten or silicon and aluminum.

Ti/TiN or $TiSi_2$ contact layers are also frequently used in the case of contacts between two conductive layers. By way of example, a TiN layer over an Al layer reduces the natural oxidation of the Al layer and, consequently, leads to low-impedance contacts or serves as an antireflection layer. Likewise, the provision of a $TiSi_2$ layer on a polysilicon gate is a measure for considerably increasing the power of MOS transistors.

Owing to the multiplicity of possible applications, metal layers, in particular titanium layers, are also the subject of a series of investigations. Thus, by way of example, the publications "Nitridal-on of Polycrysealline Titanium as Studied by in situ Angle-resolved X-ray Photoelectron Spectroscopy", A. Ermolieff et al. in "Surface and interface Analysis" Vol. 11, Pages 563–568 (1988), "Tungsten Contacts for a 256M DRAM Process Upsing A Thermally Formed TiN Diffusion Barrier", J. Gambino et al., 1996 VMIC Conference 1996 ISMIC—106/96/0180i(c), Jun. 18–20, and "Influence Of The Spuotering Method Of TiN/Ti Films On The Resistance Of High Aspect Ratio Contact Holes", R. Kanamura et al., 1996 VMIC Conference 1996 ISMIC—106/96/0554(c), Jun. 18–20 deal with properties and applications of titanium-containing layers.

The above-mentioned applications presuppose, however, particularly in the case of small structure widths, metal-containing layers of good Tuality, in order that the desired properties of the metal-containing layers can actually be obtained. In this case, effectively preventing contamination of the metal-containing layer or oxidation of the met al during the process cycle is a matter of particular importance. However, this cannot be guaranteed in the case of conventional processes for producing metal-containing layers, which leads to increased contact resistances, for example.

Summary of the Invention

It is accordingly an object of the invention to provide a process for producing metal-containing layers which overcomes the above-mentioned disadvantages of the prior art methods of this general type.

In particular, an object of the present invention is to provide a process for producing metal-containing layers which largely prevents oxidation of the metal during the process.

With the foregoing and other objects in view there is provided, in accordance with the invention, a process for producing metal-containing layers including metal-containing diffusion barriers, contact layers, and antireflection layers on a semiconductor structure, which includes:

applying a metal layer having a predetermined thickness at an elevated temperature on a semiconductor structure; and cooling the metal layer in a nitrogen-containing atmosphere resulting in a formation of a metal nitride layer.

The use of a nitrogen-containing atmosphere has the advantage, on the one hand, that the cooling time is shortened as a result of the faster heat dissipation compared with conventionally used inert gases such as argon. As a rule, this results in a distinctly increased plant throughput, which in turn has a positive effect on the fabrication costs. The cooling time can be reduced by about 40% by the use of a nitrogen-containing atmosphere.

On the other hand, otherwise unavoidable oxidation of the metal layer is considerably reduced by the metal nitride layer (passivation layer) that forms. The consequence of this is that less oxygen is incorporated in the metal layer, which enables smaller contact resistances and, ultimately, a smaller metal layer thickness as well. This in turn has a positive effect on the throughput that can be achieved. The technical possibility for using for example "Ti liners" or the use of titanium for salicide processes can thus be extended technologically for further product generations.

The metal layer is preferably applied at a temperature of more than 100° C., in particular more than 300° C.

Furthermore, it is preferred if the metal layer is cooled to a temperature of less than 100° C.

In accordance with a preferred embodiment, the metal layer is applied by a chemical vapor deposition (CVD) process or a physical vapor deposition (PVD) process, in particular a sputtering technique.

Furthermore, it is preferred if the metal used is titanium, tantalum, molybdenum or tungsten.

Preferably, a titanium layer is applied to a silicon surface.

In this case, it is particularly preferred if the titanium layer is subjected to a heat treatment after cooling in a nitrogen and hydrogen-containing atmosphere, with the result that the titanium reacts to form titanium silicide at the area of contact with the silicon.

The heat treatment should be carried out at a temperature of about 500 to 1000° C., preferably 600 to 900° C.

Furthermore, it is preferred for some applications if the titanium nitride layer is removed, preferably by wet-chemical processes, after the completion of the titanium-containing layer.

Furthermore, it is preferred if the application of the metal layer is carried out in a first chamber and the cooling of the metal layer is carried is carried out in a second chamber. The semiconductor structure is transported from the first chamber into the second chamber after the application of the metal layer, with the vacuum conditions being maintained. This effectively prevents nitridation of the metal source for the application of the metal layer.

Other features which are considered as characteristic for the invention are set forth in the appended claims.

Although the invention is illustrated and described herein as embodied in a process for producing metal-containing layers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
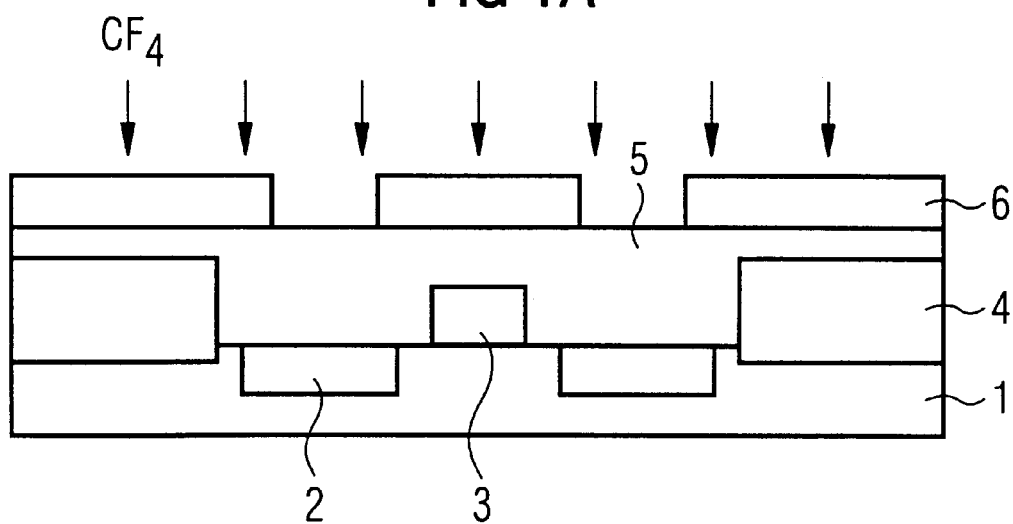
FIGS. 1a to 1d are diagrammatic, sectional views of a first embodiment of a process according to the invention.

In all the figures of the drawing, sub-features and integral parts that correspond to one another bear the same reference symbol in each case. Referring now to the figures of the drawings in detail and first, particularly, to FIG. 1a thereof, there is shown a semiconductor structure of the kind used for producing CMOS circuits. N and/or p-conducting silicon regions 2, a gate 3 and an STI isolation 4 (shallow trench isolation) are provided on a silicon wafer 1. In order to produce contacts between aluminum tracks that are still to be produced and the n and p-conducting silicon regions 2, a silicon oxide layer 5 is deposited in a large-area manner by a TEOS process, for example. The silicon oxide layer 5 is subsequently planarized by a chemical mechanical polishing (CMP) step. Afterwards, a photoresist 6 is applied to the oxide and patterned lithographically with the contact hole geometries, aligned with the structures of the silicon wafer 1. The resultant situation is shown in FIG. 1a.

Figure 1B:
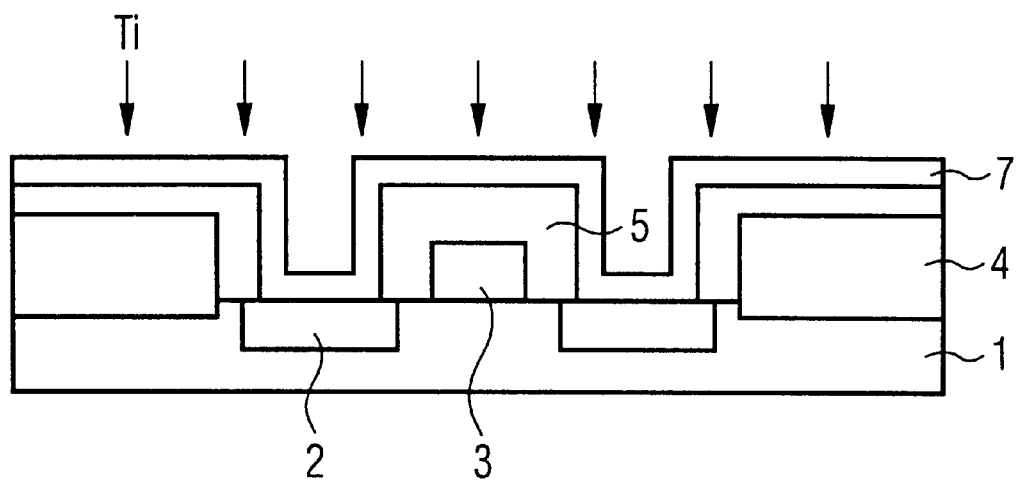

After the pattering of the photoresist 6, contact holes are etched using $CF_4$, for example, and the photoresist 6 and also, subsequently, the natural oxide on the silicon at the bottom of the contact holes are removed (for example using buffered hydrofluoric acid). In order to remove adsorbates on the wafer surface, the silicon wafer 1 is subsequently baked under vacuum conditions. The semiconductor structure prepared in this way then has a titanium layer 7 sputtered onto it (see FIG. 1b). Depending on the sputtering technique used, the layer thickness of the sputtered titanium should be adapted such that at least a titanium layer 7 of 10 nm is produced on the bottom of the contact hole. In order to obtain good contact resistance matching, the application of the titanium layer is carried out at a temperature of about 400° C. on the silicon wafer.

Figure 1C:
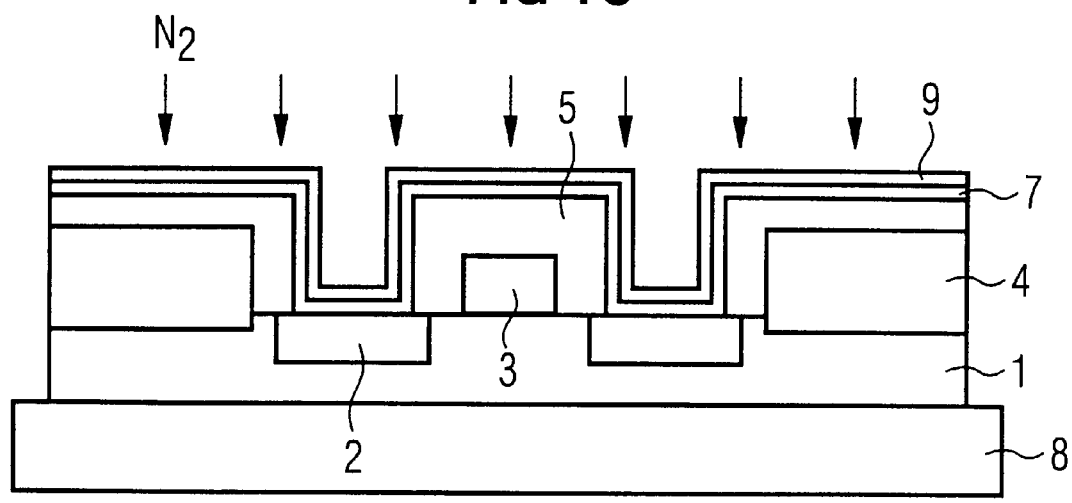

After the application of the titanium layer 7, the silicon wafer 1 is transported into a cooling chamber, with the vacuum conditions being maintained. The wafer 1, which is still hot from the sputtering, is placed on a water-cooled chuck 8 in the cooling chamber and cooled to room temperature. The cooling is achieved in this case through thermal contact with the chuck 8, the thermal radiation of the silicon wafer 1 and the interaction with the nitrogen-containing gas, for example $N_2$ or $NH_3$, present in the cooling chamber. The cooling time can be shortened by about 40% by the use of nitrogen at 10 torr, for example. Furthermore, the titanium reacts with the nitrogen and a thin titanium nitride layer 9 is formed. The resultant situation is shown in FIG. 1c.

Figure 1D:
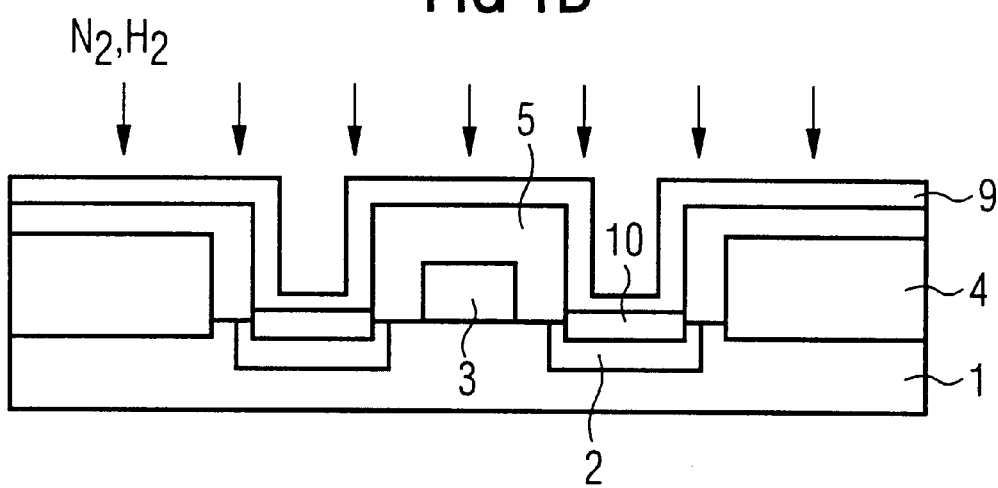

After the cooling and nitriding in the cooling chamber, the silicon wafer 1 is removed from the sputtering installation and annealed for a few minutes at about 600° C. in a furnace in an atmosphere containing nitrogen and hydrogen. Titanium silicide 10 is formed in the process at the area of the titanium which is in contact with the silicon, and the titanium nitride layer 9 is reinforced, with the result that, as a rule, there is no longer any pure titanium remaining. The resultant situation is shown in FIG. 1d.

Afterwards, in order to fill the contact holes, tungsten is deposited by a CVD process, for example, and the CMOS circuit can be completed in a customary manner.

Figure 2A:
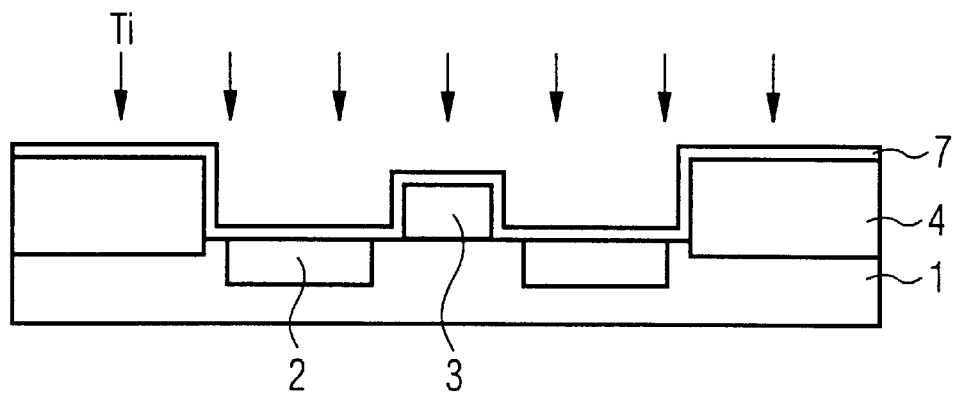
FIGS. 2a to 2d are sectional views of a second embodiment of the process.

FIGS. 2a to 2d show a schematic illustration of a second embodiment of the process according to the invention. FIG. 2a shows a semiconductor structure of the kind used for producing CMOS circuits. The n and/or p-conducting silicon regions 2, the gate 3 and the STI isolation 4 are provided on the silicon wafer 1. In order to fabricate a titanium silicide layer in the subsequent contact hole regions, first of all the natural oxide layer on the silicon is removed by wet-chemical cleaning (for example using buffered hydrofluoric acid).

In order to remove adsorbates on the wafer surface, the silicon wafer 1 is subsequently baked under vacuum conditions at about 350° C. The semiconductor structure prepared in this way then has the titanium layer 7 sputtered onto it. The thickness of the titanium layer 7 produced should in this case be adapted to the titanium silicide layer thickness sought.

Figure 2B:
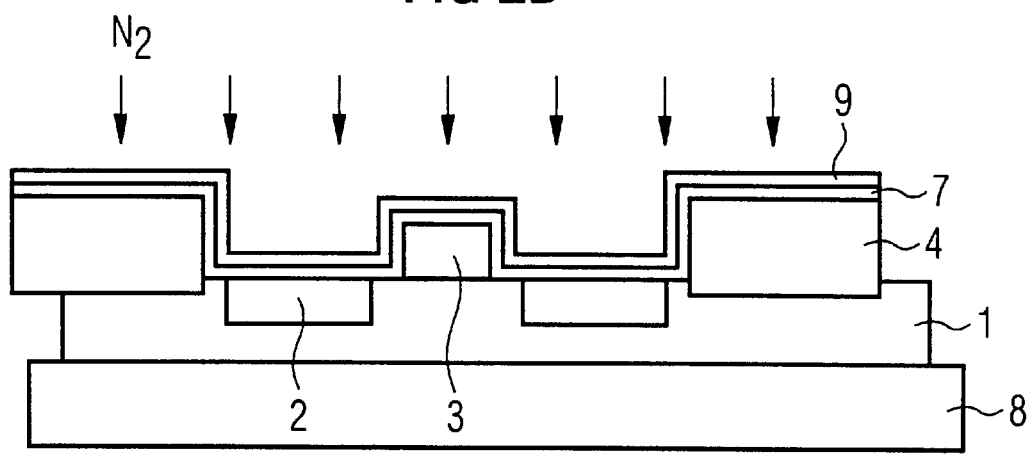

After the application of the titanium layer 7, the silicon wafer is transported into the cooling chamber, with the vacuum conditions being maintained. The wafer 1, which is still hot from the sputtering, is placed on the water-cooled chuck 8 in the cooling chamber and cooled to room temperature. The cooling is achieved in this case through thermal contact with the chuck 8, the thermal radiation of the silicon wafer 1 and the interaction with the nitrogen-containing gas, for example $N_2$ or $NH_3$, present in the cooling chamber. The cooling time can be shortened by about 40% by the use of nitrogen at 10 torr, for example. Furthermore, the titanium reacts with the nitrogen and the thin titanium nitride layer 9 is formed. The resultant situation is shown in FIG. 2b.

Figure 2C:
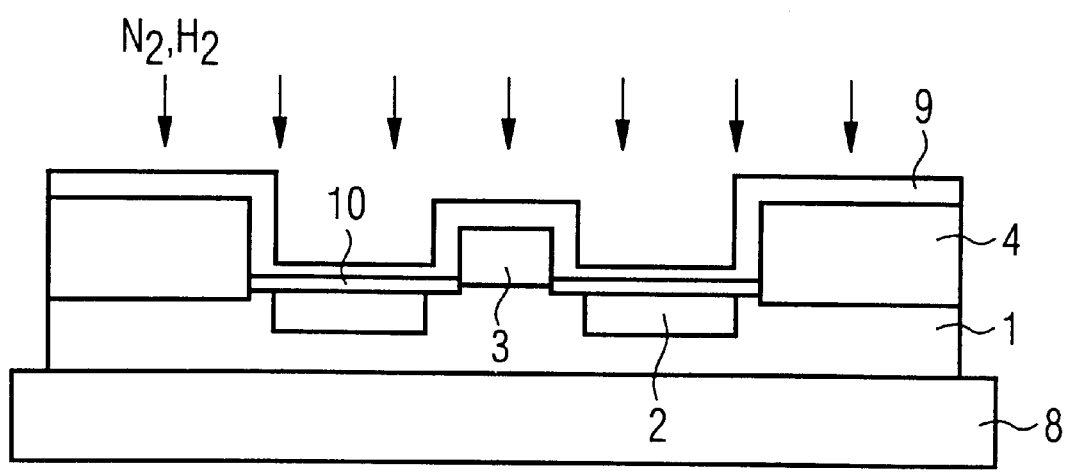
Figure 2D:
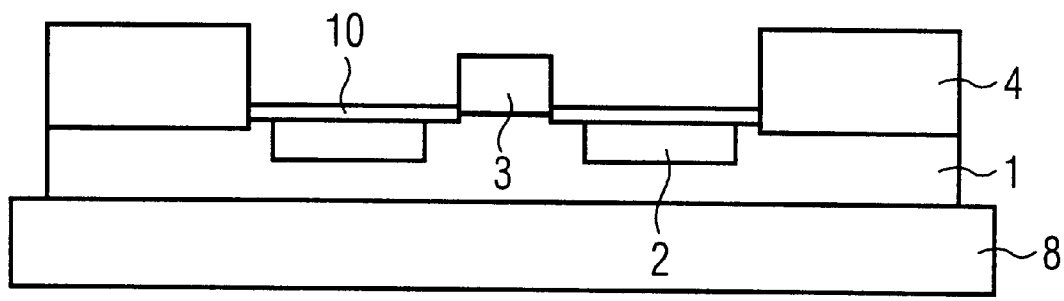

The cooled wafer 1 is then removed from the sputtering installation and passed into a furnace with a nitrogen and hydrogen-containing atmosphere for the purpose of saliciding. At a temperature of about 900° C., the titanium reacts to form titanium silicide 10 at the area of the titanium that is in contact with the silicon. Furthermore, the titanium nitride layer 9 is reinforced, with the result that, as a rule, there is no longer any pure titanium remaining. The resultant situation is shown in FIG. 2c.

After the annealing step, the titanium nitride layer 9 is removed by a wet-chemical process, for example using an ammonia and hydrogen peroxide-containing acid, with the result that titanium silicide 10 remains on the silicon surfaces.

We claim:

1. A process for producing metal-containing layers including metal-containing diffusion barriers, contact layers, and antireflection layers on a semiconductor structure, which comprises:

applying a metal layer having a predetermined thickness at an elevated temperature on a semiconductor structure; and after the metal layer has been applied, cooling the metal layer in a nitrogen-containing atmosphere resulting in a formation of a metal nitride layer.

2. The process according to claim 1, which comprises applying the metal layer at a temperature of more than 100° C.

3. The process according to claim 1, which comprises applying the metal layer at a temperature of more than 300° C.

4. The process according to claim 1, which comprises cooling the metal layer to a temperature of less than 100° C.

5. The process according to claim 1, which comprises applying the metal layer with one of a chemical vapor deposition process and a physical vapor deposition process including a sputtering technique.

6. The process according to claim 1, which comprises providing the metal layer as a metal selected from the group consisting of titanium, tantalum, molybdenum and tungsten.

7. The process according to claim 1, which comprises applying a titanium layer as the metal layer and the semiconductor structure has a silicon surface upon which the titanium layer is applied.

8. The process according to claim 7, which comprises subjecting the titanium layer to a heat treatment in a nitrogen and hydrogen-containing atmosphere resulting in the titanium layer reacting to form titanium silicide at an area of contact with the silicon surface after the cooling step.

9. The process according to claim 8, which comprises carrying out the heat treatment step at a temperature of about 500 to 1000° C.

10. The process according to claim 8, which comprises carrying out the heat treatment step at a temperature of about 600 to 900° C.

11. The process according to claim 1, which comprises removing the metal nitride layer.

12. The process according to claim 1, which comprises removing the metal nitride layer using a wet-chemical process.

13. The process according to claim 1, which comprises carrying out the applying of the metal layer step in a first chamber and the cooling of the metal layer step in a second chamber under vacuum conditions, and transporting the semiconductor structure from the first chamber into the second chamber after the application of the metal layer with the vacuum conditions being maintained.

* * * * *